(12) United States Patent
Kropf

(10) Patent No.: US 7,224,017 B2
(45) Date of Patent: May 29, 2007

(54) DEVICE WITH INTEGRATED CAPACITANCE STRUCTURE

(75) Inventor: Claus Kropf, Landskron (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/238,114

(22) Filed: Sep. 29, 2005

(65) Prior Publication Data

US 2006/0071297 A1   Apr. 6, 2006

(30) Foreign Application Priority Data

Sep. 30, 2004   (DE) ...................... 10 2004 047 660

(51) Int. Cl.
*H01L 21/8242*   (2006.01)
(52) U.S. Cl. ........................ 257/307; 257/532; 257/534
(58) Field of Classification Search ................. 257/307
See application file for complete search history.

(56) References Cited

U.S. PATENT DOCUMENTS

| | | |
|---|---|---|
| 5,583,359 A | 12/1996 | Ng |
| 6,208,500 B1 | 3/2001 | Alexander |
| 6,411,492 B1 | 6/2002 | Kar-Roy |
| 6,743,671 B2 * | 6/2004 | Hu et al. ..................... 438/253 |

FOREIGN PATENT DOCUMENTS

DE   10217565 A1   11/2003

* cited by examiner

*Primary Examiner*—Leonardo Andujar
(74) *Attorney, Agent, or Firm*—Morrison & Foerster LLP

(57) ABSTRACT

The present invention relates to a device with integrated capacitance structure has at least one first and an adjacent second rewiring plane, each of which comprises at least one first partial structure and a second partial structure, which is different from the first partial structure, the second partial structure in each case substantially surrounding the first partial structure, and the first partial structure of the first rewiring plane being electrically connected to the second partial structure of the second rewiring plane and the second partial structure of the first rewiring plane being electrically connected to the first partial structure of the second rewiring plane and forming different poles of the capacitance structure.

6 Claims, 3 Drawing Sheets

DEVICE WITH INTEGRATED CAPACITANCE STRUCTURE

CLAIM FOR PRIORITY

This application claims the benefit of priority to German Application No. 10 2004 047 660.8 which was filed in the German language on Sep. 30, 2004,the contents of which are hereby incorporated by reference.

TECHNICAL FIELD OF THE INVENTION

The present invention relates to a device with integrated capacitance structure.

BACKGROUND OF THE INVENTION

In semiconductor technology, for the integration of analogue circuit elements, there is a need for passive components, in particular capacitances, of high production quality and reproducibility in conjunction with a large capacitance value and a small area requirement. Since the advancing large-scale integration of semiconductor components means that the lateral dimensions are decreasing to a greater extent in relation to the vertical dimension, the lateral portions of capacitance structures are increasingly gaining in importance.

In the case of a capacitance structure disclosed in U.S. Pat. No. 6,411,492 B1, hexagonal capacitance elements can be integrated into a fabrication process only in a comparatively complicated manner by means of conventional design and layout tools.

A further embodiment of a capacitance structure is disclosed in DE 102 17 565 A1. Within a lattice structure with a virtually body-centred cubic elementary cell, square metal dots are realized as first partial structures in each metallization plane, which are completely enclosed by square lattice frames as second partial structures. In this case, a stack sequence is realized in which, in every second plane, a partial structure is displaced relative to the previous partial structure by in each case half a lateral lattice vector in the x or y direction. Every further partial structure thus completely covers its last but one partial structure again. In the case of this capacitance structure, the vertical partial capacitances are utilized only in very point-like fashion, namely substantially only at the crossover points of two lattice frames lying one above the other. The greatly different structure dimensions of metal dots and lattice frames are disadvantageous in terms of design, layout and production engineering. Since the connecting elements (vias) proceed from crossover points of the lattice structure, a comparatively small lateral misalignment may result in defective contact-connection. Known capacitance structures of this type can be integrated only with difficulty in existing standard cell libraries.

SUMMARY OF THE INVENTION

The present invention provides a device with integrated capacitance structure which requires a maximum capacitance value in conjunction with a minimum volume requirement, in particular also in conjunction with a minimum lateral area requirement.

In one embodiment according to the invention, the capacitance structure is applied to a substrate, for example a semiconductor substrate. The substrate may typically be composed of monocrystalline or polycrystalline silicon. However, other semiconductor materials such as, for example, silicon carbide (SiC) or gallium arsenide (GaAs) are also possible. A first integrated rewiring plane is applied above the substrate either directly or by way of an additional insulation layer. The rewiring plane is patterned to the effect that it is subdivided into two electrically conductive regions, called partial structures hereinafter, which are completely electrically isolated. These two partial structures, which form the two polarities of the capacitance structure, are arranged in such a way that a partial structure of a first type is substantially enclosed by the partial structure of a second type. In this case, "substantially enclosed" is to be understood to mean that approximately ¾ of the edge of the first partial structure is surrounded by the second partial structure.

A first insulation layer is situated above the first rewiring plane. This insulation layer isolates the first rewiring plane from a second integrated rewiring plane applied above the first insulation layer.

According to another embodiment of the invention, the second rewiring plane is in turn divided into a first partial structure and a second partial structure. The first and second partial structures of the second rewiring plane are embodied in substantially the same way as the first and second partial structures of the first rewiring plane. The two rewiring planes are furthermore patterned in such a way that there is no difference in the positions of their respective partial structures within a system of xy coordinates lying in the plane thereof, or lateral system of xy coordinates, along the first coordinate axis defined by the shorter preferred axis or extent of the partial structures. A relative displacement of the respective partial structures is present exclusively along the second coordinate axis defined by the longer preferred axis. However, such a displacement is not limited to the longer preferred axis. It may, if appropriate, also be effected along the shorter preferred axis. This holds true particularly when the dimensions of the partial structures along the preferred axes do not deviate greatly from one another. It is not necessary for the base vectors of the preferred axes to form a specific angle. In one preferred embodiment, however, the base vector of the shorter preferred axis, for example, is perpendicular to the base vector of the longer preferred axis, so that a system of Cartesian coordinates is present with the base vector z oriented perpendicularly to the substrate plane.

Furthermore, the first partial structure of the first rewiring plane is connected to the second partial structure of the second rewiring plane by means of an electrically conductive connecting element, while the second partial structure of the first rewiring plane is connected to the first partial structure of the second rewiring plane in the same way. The connecting elements may be realized for example by vias known from semiconductor technology. The vias may be composed e.g. of the same material as the partial structures mentioned above. However, customary via materials such as e.g. tungsten (W) or tungsten alloys are also appropriate for this application.

A capacitance structure constructed in this way has a high capacitance value in conjunction with a small volume requirement, in particular also in conjunction with a small lateral area requirement. Cost-optimized fabrication is thereby possible.

One advantage of the device according to the invention is that the capacitance structures can be fabricated with high production quality in conjunction with a high yield. Simple adoption into existing tools for layout and design creation is possible, moreover.

In one preferred exemplary embodiment, for optimum utilization of the lateral capacitance portions, the distance between the first and second partial structures is configured to be a minimum. These minimum distances are generally prescribed by the design rules of the current technology generation and typically range in an order of magnitude of 2 s, where s represents a measure of the order of magnitude of the transistor gate length or line width of the metallization. Each two partial structures of the first and second rewiring planes represent a basic cell of a possible, more comprehensive capacitance structure of the device. For adaptation to an existing circuit arrangement, these basic cells can be continued in all three spatial directions. In order in this case to minimize the lateral area requirement—whilst at the same time maximizing the total capacitance—the basic cells are predominantly arranged periodically. In particular a periodically regular stack sequence with alternating polarity of the overlapping partial structures proves to be particularly advantageous.

An alternating stack sequence that does not recur periodically, however, as far as both the geometrical congruence and the polarity of the partial structures are concerned, may be advantageous in specific applications. Particularly if capacitance structures are integrated in large or complex semiconductor components, it may be necessary to utilize individual rewiring planes or parts of rewiring planes for optimizing the properties of other active or passive circuit elements.

In a further preferred embodiment of the invention, the structure widths of the two partial structures match within the scope of production accuracy. This ensures that, on the one hand, a high yield of the metallization and CMP processes (CMP=Chemical Mechanical Polishing) required in production is achieved and on the other hand that a homogeneous metal/non-metal distribution is achieved in the device. This last has the effect that low thermomechanical loading can be expected in product operation.

In another preferred embodiment of the invention, the first partial structure is embodied in rod-type fashion and enclosed by the partial structure of the second type in frame-type fashion. In this case, "rod-type fashion" is to be understood to mean that the first partial structure is at least twice as long in its longitudinal direction as in its transverse direction. This frame-type configuration makes it possible for there to be, in the case of vertical stacking, a maximum overlap of the respective second partial structures in the direction of the longer preferred axis. Maximum utilization of the vertical capacitance portions is thereby ensured.

Since, as technological development increases, the structure distances within the rewiring planes are decreasing further and further, the lateral capacitance portion of integrated semiconductor capacitance structures is increasingly gaining in importance at the expense of the vertical portion. This effect is taken into account in that the lateral distance between two partial structures, at least at one location, does not exceed the value of 0.25 μm. In a further embodiment of the invention, which is optimized in terms of layout engineering, in a multiple stack sequence the required connecting elements are implemented perpendicularly from the bottommost to the topmost rewiring plane. This permits a minimum lateral area requirement of the device according to the invention with minimization of the number of defective contact-connections brought about e.g. by design, layout or production fluctuation.

In a further embodiment, there is no difference in the position of at least two partial structures within a system of xy coordinates lying in the plane thereof, or a lateral system of xy coordinates, along the first coordinate defined by the shorter preferred axis or extent of the partial structures.

Finally, in a further embodiment of the invention, it is also advantageous if the partial structures are electrically conductively connected to one another in the same way by means of vias. In this case, it is furthermore preferred for at least one via to rectilinearly connect at least two partial structures having different polarities of two rewiring planes.

BRIEF DESCRIPTION OF THE DRAWINGS

The invention is described in more detail below with reference to exemplary embodiments and the figures, in which.

In the figures, identical reference symbols designate identical or functionally identical elements.

DETAILED DESCRIPTION OF THE INVENTION

Figure 1:
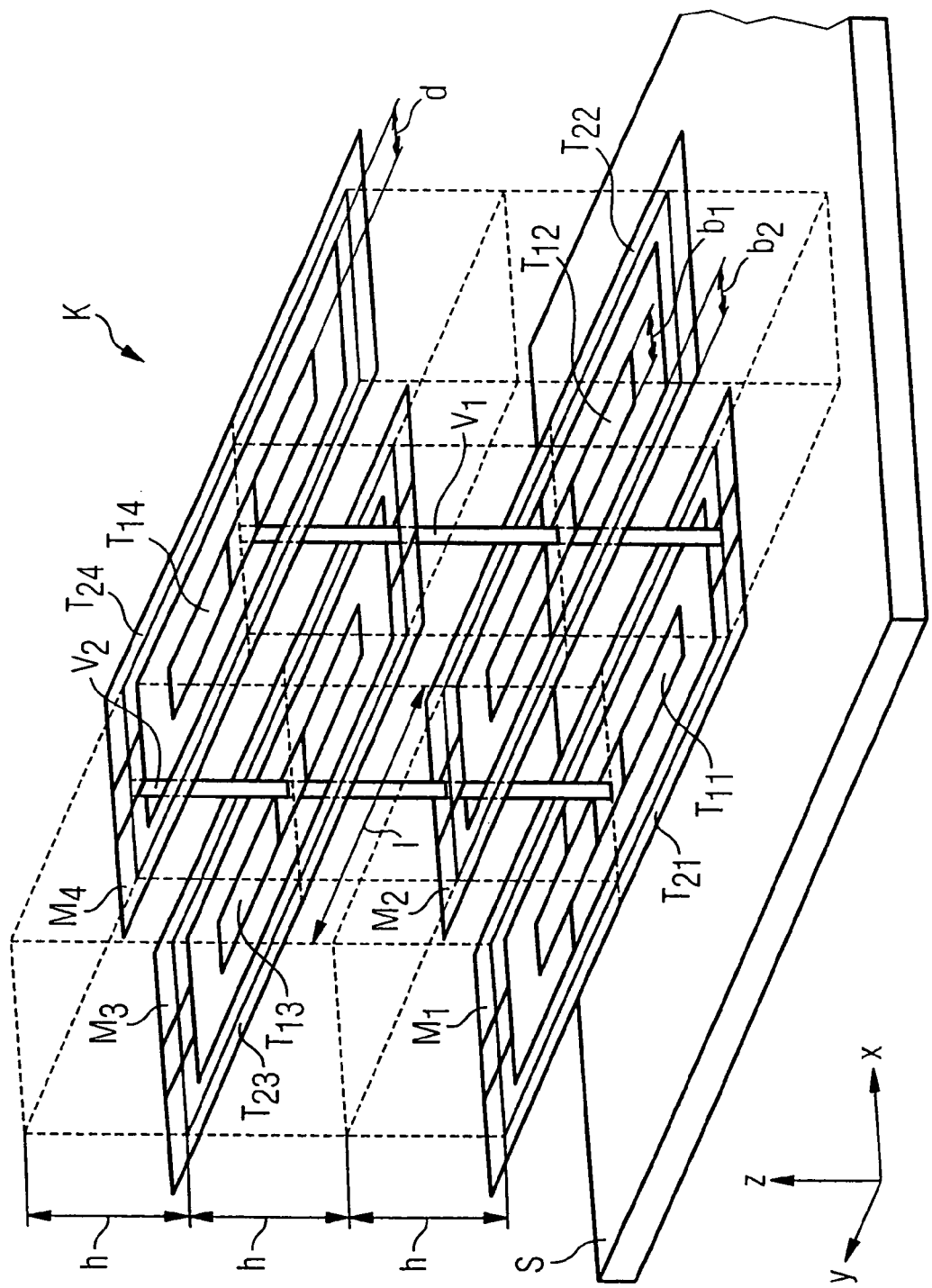
FIG. 1 shows a first exemplary embodiment of the invention.

In FIG. 1, a semiconductor device has a capacitance arrangement or structure K embedded in an insulation layer or a system of insulation layers (not illustrated). The insulation layer used may be a layer or a layer sequence comprising silicon dioxide ($SiO_2$), silicon nitride ($Si_3N_4$) or some other suitable insulating material. The insulation layer and the capacitance structure K are situated above a substrate S made, for example, of silicon (Si) or silicon carbide (SiC). An integrated circuit or a semiconductor component may be realized in the semiconductor substrate, so that the device is formed by this and the capacitance structure K. The substrate S may also be formed by a printed circuit or the like.

A first rewiring plane $M_1$ is patterned in such a way that a first partial structure $T_{11}$ is enclosed by a second partial structure $T_{21}$. The distance between the two partial structures should preferably not exceed 250 nm in order to ensure optimum utilization of area. The partial structure $T_{11}$ is spaced apart from the partial structure $T_{21}$. The two partial structures $T_{11}$ and $T_{21}$, which are repeated in the vertical or z direction (cf. the coordinate vectors x, y and z) in similar form in at least one further rewiring plane $M_2$ as partial structures $T_{12}$ and $T_{22}$, form the two electrodes of the capacitance structure K. Suitable materials for the partial structures are aluminium (Al) or copper (Cu). However, it is also possible to use other materials or alloys, in particular alloys based on Al and/or Cu.

In the present exemplary embodiment, the two partial structures $T_{11}$ and $T_{21}$ are repeated four times in total, so that partial structures $T_{13}$ and $T_{23}$ of a third rewiring plane $M_3$ and partial structures $T_{14}$ and $T_{24}$ of a fourth rewiring plane $M_4$ are also present in addition to the partial structures $T_{12}$ and $T_{22}$. The two partial structures $T_{12}$ and $T_{22}$ in the second rewiring plane $M_2$ are displaced in the y direction by an offset l with respect to the partial structures $T_{11}$ and $T_{21}$ of the first rewiring plane $M_1$. The same applies to the following rewiring planes. By means of a respective connecting element $V_1$ and $V_2$, an electrically conductive connection perpendicular to the x-y plane is produced between both the second partial structure $T_{22}$ of the second rewiring plane $M_2$ with the first partial structure $T_{11}$ of the first rewiring plane $M_1$ and the first partial structure $T_{12}$ of the second rewiring plane $M_2$ with the second partial structure $T_{21}$ of the first rewiring plane $M_1$. The same applies to the following rewiring planes. In the exemplary embodiment shown, the connecting elements $V_1$ and $V_2$ are shown as vias leading through rectilinearly between all the wiring planes. This need not be the case. The connecting elements may also be arranged offset with respect to one another between the respective rewiring planes. The present exemplary embodiment furthermore shows how the useful capacitance is doubled by a doubling of the capacitance elementary cell provided by the patterning of the rewiring planes $M_1$ and $M_2$ by means of the rewiring planes $M_3$ and $M_4$. The lateral distance d between the two partial structures $T_{1i}$ and $T_{2i}$(i=1, . . . 4) is prescribed by the design rules and is chosen to be a minimum in order to maximum the useful capacitance. The lateral structure widths $b_1$, $b_2$ of the partial structures $T_{1i}$, $T_{2i}$ are chosen to be substantially identical in order to increase the production yield.

Figure 2:
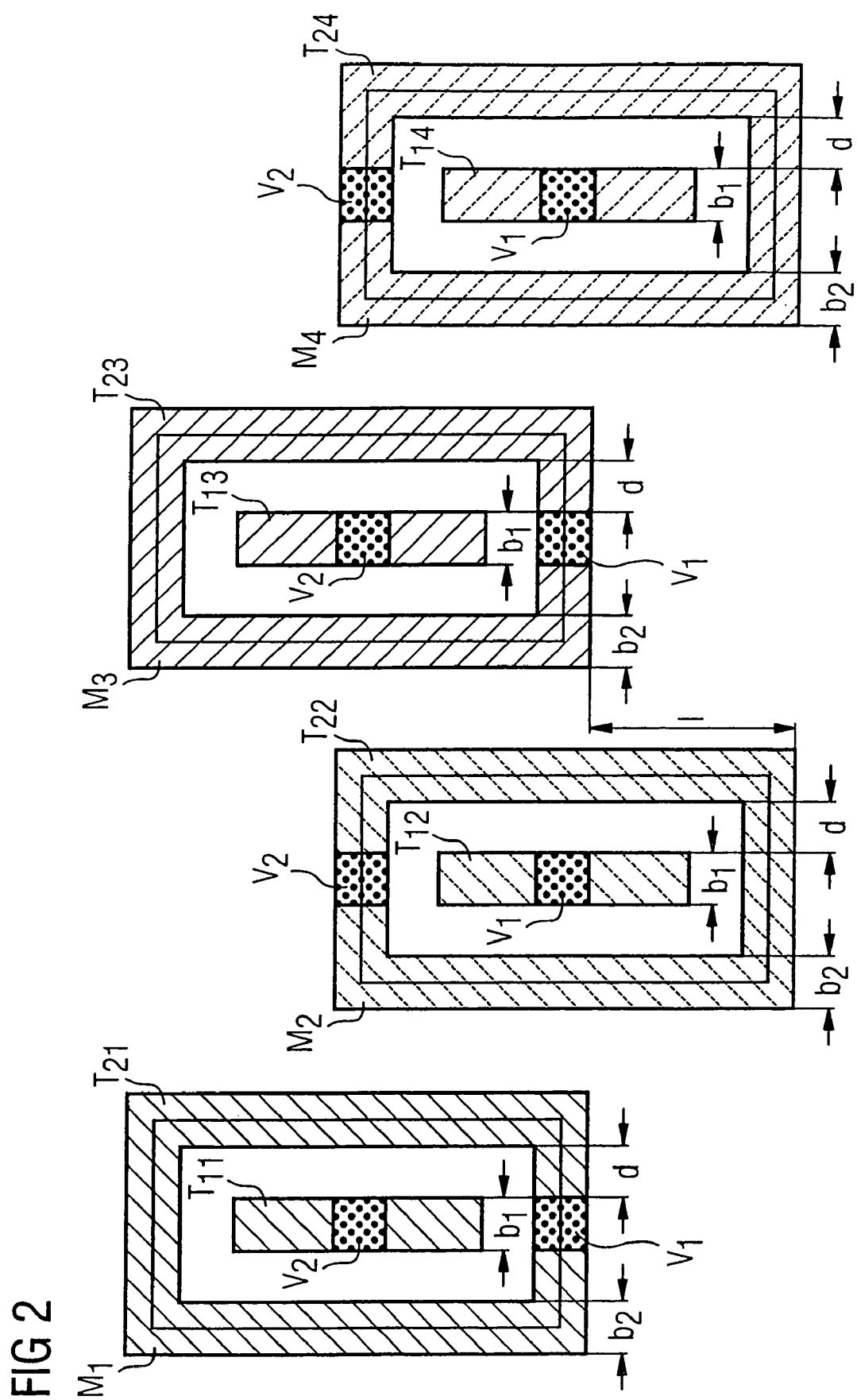
FIG. 2 shows a plan view of four partial structure pairs that produce the exemplary embodiment of the device according to the invention as shown in FIG. 1.

FIG. 2 illustrates the layout of the four patterned rewiring planes $M_1$ to $M_4$ shown in FIG. 1. In this preferred embodiment, the partial structures $T_{1i}$ and also $T_{2i}$ of all four rewiring planes $M_1$ to $M_4$ are identical. The lateral offset l is chosen such that the first connecting element $V_1$ runs centrally from the first partial structure $T_{11}$ of the first rewiring plane $M_1$ centrally to the short side of the second partial structure $T_{22}$ of the second rewiring plane $M_2$. The same applies correspondingly to the higher rewiring planes and to the second connecting element $V_2$.

Figure 3:
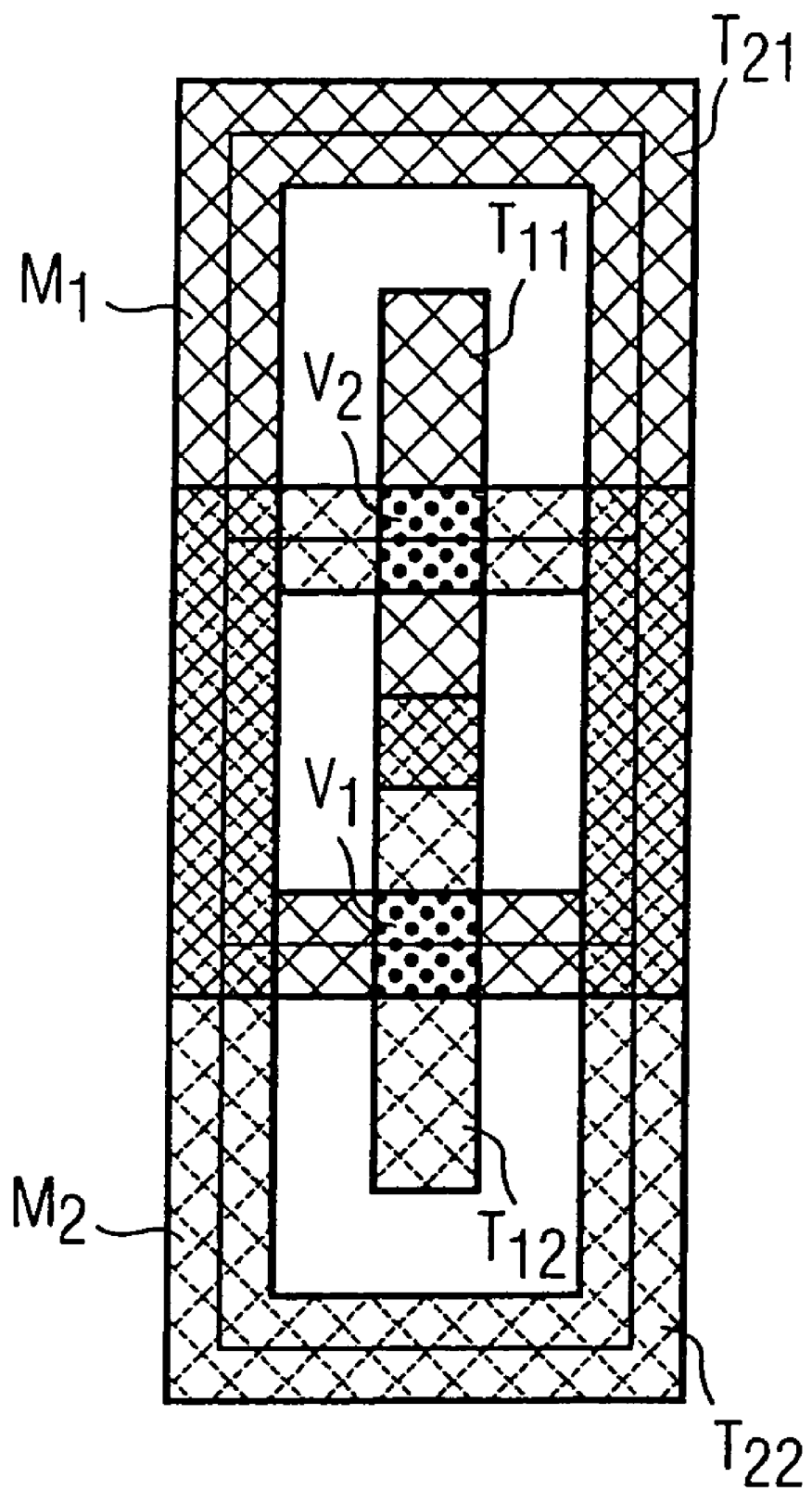
FIG. 3 shows a plan view of the exemplary embodiment of the device according to the invention as shown in FIG. 1.

FIG. 3 illustrates the plan view of the rewiring planes $M_1$, $M_2$ divided into two partial structures $T_1$, $T_2$ in each case. While the partial structures $T_1$, $T_2$ completely overlap in the x direction, the lateral offset l exists in the y direction. A respective connecting element $V_1$ and $V_2$ connects, on the one hand, the first partial structure $T_{11}$ of the first rewiring plane $M_1$ to the second partial structure $T_{22}$ of the second rewiring plane $M_2$ and, on the other hand, the second partial structure $T_{21}$ of the first rewiring plane $M_1$ to the first partial structure $T_{12}$ of the second rewiring plane $M_2$.

LIST OF REFERENCE SYMBOLS

K Capacitance structure
$M_1$ First rewiring plane
$M_2$ Second rewiring plane
$M_n$ n-th rewiring plane
$T_{1i}$ First partial structure in i-th plane
$T_{2i}$ Second partial structure in i-th plane
Tn n-th partial structure
$b_1$ Structure width of the first partial structure
$b_2$ Structure width of the second partial structure
d Lateral distance between the partial structures
h Vertical distance between the partial structures
$V_1$ First connecting element
$V_2$ Second connecting element
S Substrate
x, y Lateral coordinates, parallel to the S plane
z Vertical coordinate, perpendicular to the S plane
l Lateral displacement distance

What is claimed is:

1. A device with an integrated capacitance structure, comprising:
at least one first and an adjacent second rewiring plane, each of which has at least one first partial structure and a second partial structure, which is different from the first partial structure,
the first partial structure of the first and the second rewiring planes being identical in construction,
the second partial structures of the first and the second rewiring planes being identical in construction,
the arrangement of the first and second partial structures being identical in each reqiring plane such that each rewiring plane is identical in construction,
the second partial structure in each case substantially surrounding the first partial structure, and
the first partial structure of the first rewiring plane being electrically connected to the second partial structure of the second rewiring plane by means of linear electrically conductive vias and the second partial structure of the first rewiring plane being electrically connected to the first partial structure of the second rewiring plane by means of linear electrically conductive vias, such that the first partial structures of the first and the second rewiring planes become oppositely charged and that the second partial structures of the first and the second rewiring plans become oppositely charged, wherein
the first partial structure has a length extent which is larger than its width extent and runs along a preferred direction,
the first and second partial structures of the second rewiring plane are offset in a direction relative to the first and second partial structures of the first rewiring plane to create a region that can be utilized for the electrical connection,
the first partial structure of the first rewiring plane at least partly overlaps with the second partial structure of the second rewiring plane,
the second partial structure of the first rewiring plane at least partly overlaps with the first partial structure of the second rewiring planes, and
the first partial structures of the first and second rewiring planes at least partly overlap and the second partial structures of the first and second rewiring planes at least partly overlap.

2. The device according to claim 1, wherein a structure width of the first partial structure substantially matches a structure width of the second partial structure.

3. The device according to claim 1, wherein the second partial structure is formed in frame-type fashion and completely surrounds the first partial structure.

4. The device according to claim 1, wherein the first partial structure is formed in rod-type fashion.

5. The device according to claim 1, wherein the distance between the first partial structure and the second partial structure is less than 250 nm.

6. The device according to claim 1, wherein electrically conductive vias for connecting the partial structures) are embodied substantially perpendicular to the rewiring planes.

* * * * *